(12) United States Patent
Araki et al.

(10) Patent No.: US 12,719,489 B2
(45) Date of Patent: Aug. 25, 2026

(54) SEMICONDUCTOR INTEGRATED CIRCUIT, RECEIVING DEVICE, AND RECEIVING METHOD

(71) Applicant: Kioxia Corporation, Tokyo (JP)

(72) Inventors: Mai Araki, Kawasaki (JP); Fumihiko Tachibana, Yokohama (JP)

(73) Assignee: Kioxia Corporation, Tokyo (JP)

( * ) Notice: Subject to any disclaimer, the term of this patent is extended or adjusted under 35 U.S.C. 154(b) by 61 days.

(21) Appl. No.: 18/980,020

(22) Filed: Dec. 13, 2024

(65) Prior Publication Data

US 2025/0300668 A1 Sep. 25, 2025

(30) Foreign Application Priority Data

Mar. 21, 2024 (JP) ................................ 2024-045427

(51) Int. Cl.
*H03M 1/12* (2006.01)
*H03M 1/08* (2006.01)

(52) U.S. Cl.
CPC ....... *H03M 1/1255* (2013.01); *H03M 1/0836* (2013.01); *H03M 1/126* (2013.01)

(58) Field of Classification Search
CPC ... H03M 1/1255; H03M 1/0836; H03M 1/126
See application file for complete search history.

(56) References Cited

U.S. PATENT DOCUMENTS

| | | | | |
|---|---|---|---|---|
| 6,731,917 | B1 * | 5/2004 | Krishna | H04B 1/16 455/313 |
| 8,102,289 | B2 * | 1/2012 | Oshima | H03M 1/1028 341/161 |
| 9,584,145 | B1 * | 2/2017 | Shin | H03M 1/1028 |
| 10,218,491 | B2 | 2/2019 | Hashimoto | |
| 2013/0241753 | A1 * | 9/2013 | Nozaki | H03M 1/0626 341/118 |
| 2014/0368364 | A1 * | 12/2014 | Hsu | H03M 1/0624 341/118 |

(Continued)

FOREIGN PATENT DOCUMENTS

| | | | |
|---|---|---|---|
| JP | 2016116226 | A | 6/2016 |
| JP | 2018196000 | A | 12/2018 |

(Continued)

*Primary Examiner* — Jaison Joseph
(74) *Attorney, Agent, or Firm* — Maier & Maier, PLLC

(57) ABSTRACT

In general, according to one embodiment, a semiconductor integrated circuit includes the following configuration. A first converter samples a first digital value from an analog signal based on a first clock signal. A second converter samples a second digital value from the analog signal based on a second clock signal differing from the first clock signal by a first phase. A first processing circuit calculates phase shifts of the first and second clock signals based on the first and second digital values and using a first frequency of a third clock signal. A second processing circuit generates a control signal for correcting the phase shifts of the first and second clock signals based on the phase shifts calculated by the first processing circuit and using a second frequency of a fourth clock signal. The second frequency is $2^m$ times the first frequency.

18 Claims, 8 Drawing Sheets

(56) References Cited

U.S. PATENT DOCUMENTS

2015/0188555 A1* 7/2015 Kimura ................. H03M 1/002
341/118
2016/0174293 A1 6/2016 Mow et al.
2022/0069852 A1* 3/2022 Harada ................ H04B 1/0092
2024/0188230 A1 6/2024 Kimura
2025/0253954 A1* 8/2025 Burke .............. H04B 10/25759
2025/0300668 A1* 9/2025 Araki .................. H03M 1/1215

FOREIGN PATENT DOCUMENTS

JP 2023136009 A 9/2023
WO 2016/046883 A1 3/2016

* cited by examiner

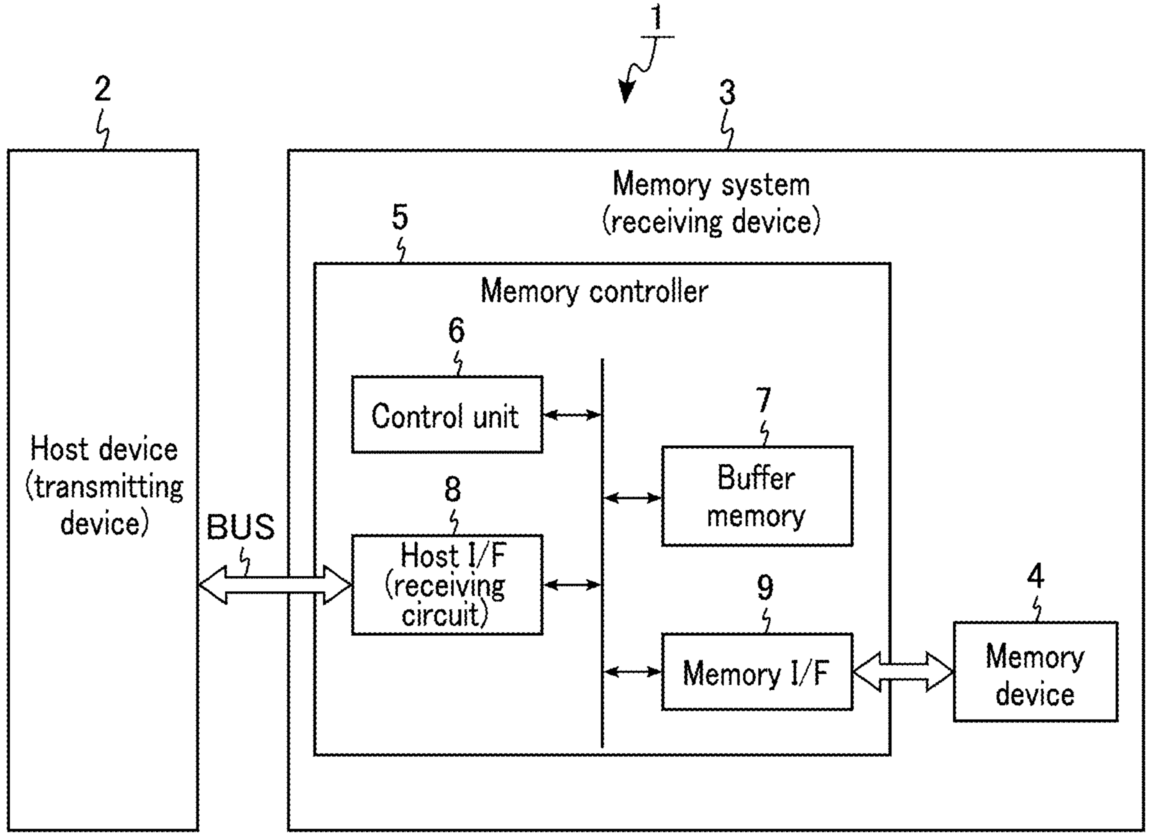
F I G. 1

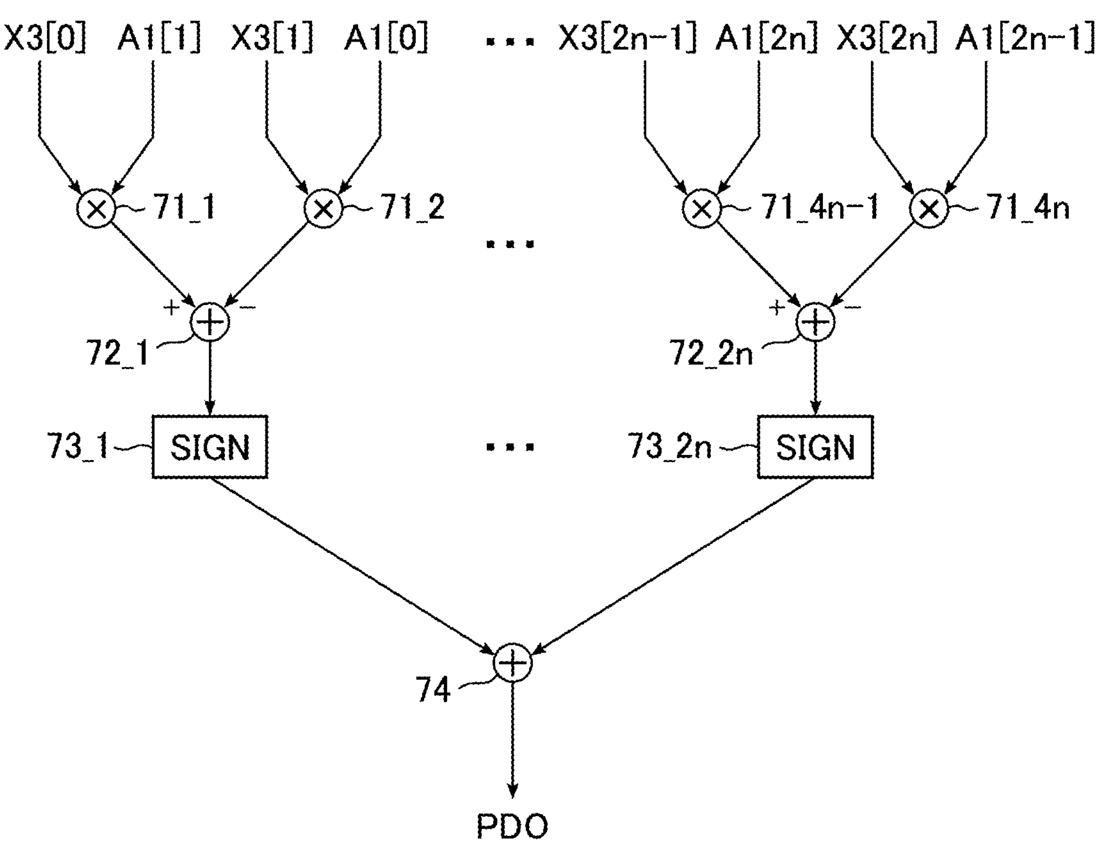
F I G. 4

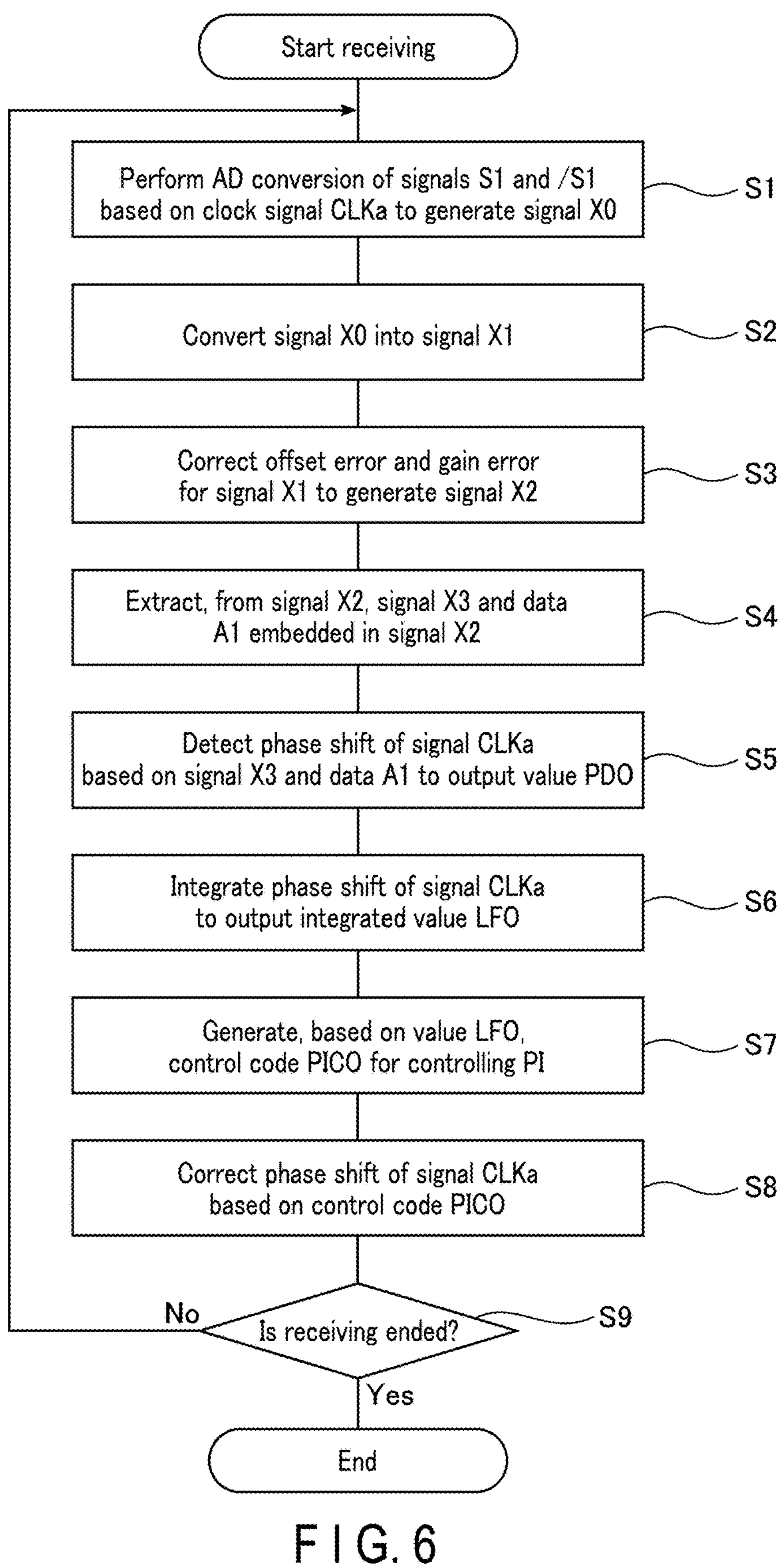
F I G. 6

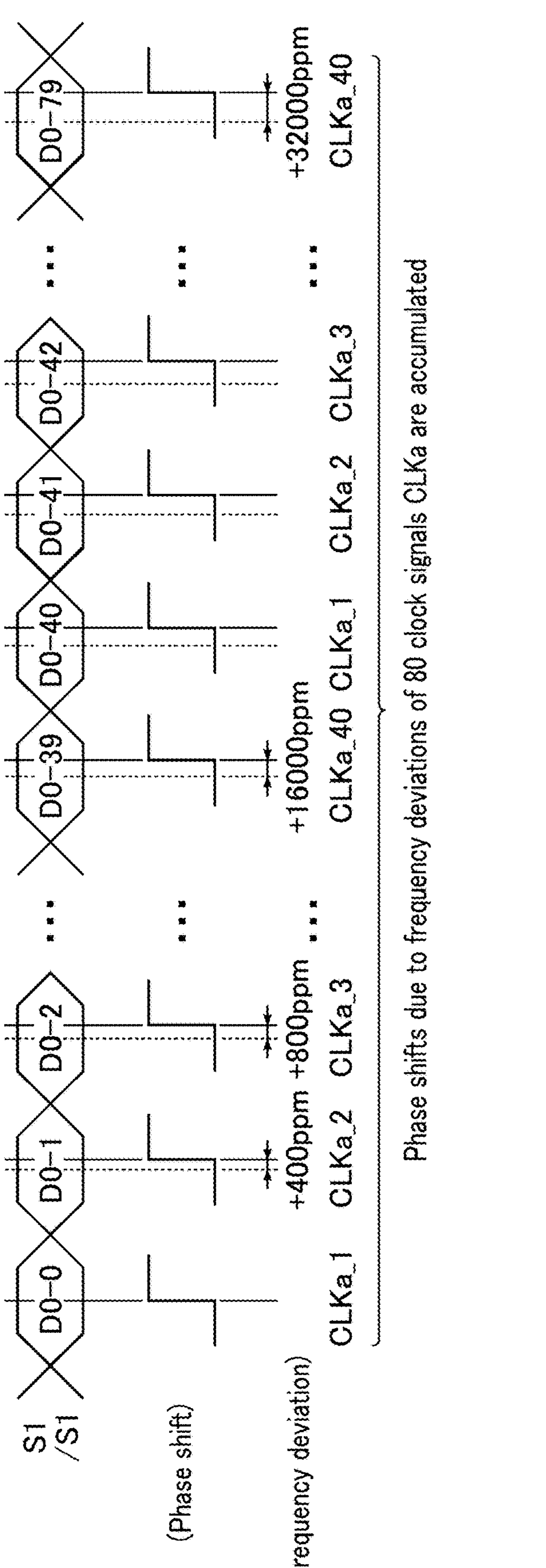
F I G. 8

SEMICONDUCTOR INTEGRATED CIRCUIT, RECEIVING DEVICE, AND RECEIVING METHOD

CROSS-REFERENCE TO RELATED APPLICATIONS

This application is based upon and claims the benefit of priority from Japanese Patent Application No. 2024-045427, filed Mar. 21, 2024, the entire contents of which are incorporated herein by reference.

FIELD

Embodiments described herein relate generally to a semiconductor integrated circuit, a receiving device, and a receiving method.

BACKGROUND

A transmitting device and a receiving device are connected via a transmission path. The receiving device receives a receive signal which has passed through the transmission path. The receiving device includes a semiconductor integrated circuit for processing the receive signal. The receiving device regenerates a clock signal based on the receive signal. The receiving device reproduces data from the receive signal based on the regenerated clock signal.

BRIEF DESCRIPTION OF THE DRAWINGS

FIG. 1 is a block diagram showing an exemplary configuration of an information processing system which includes a receiving device according to an embodiment.

FIG. 4 is a block diagram showing an exemplary configuration of a phase detecting circuit in the receiving circuit according to the embodiment.

FIG. 6 is a flowchart showing an exemplary operation of the receiving circuit in the receiving device according to the embodiment.

FIG. 8 is a timing chart showing a relationship between given signals and clock signals in an ADC according to a comparative example.

DETAILED DESCRIPTION

Figure 2:
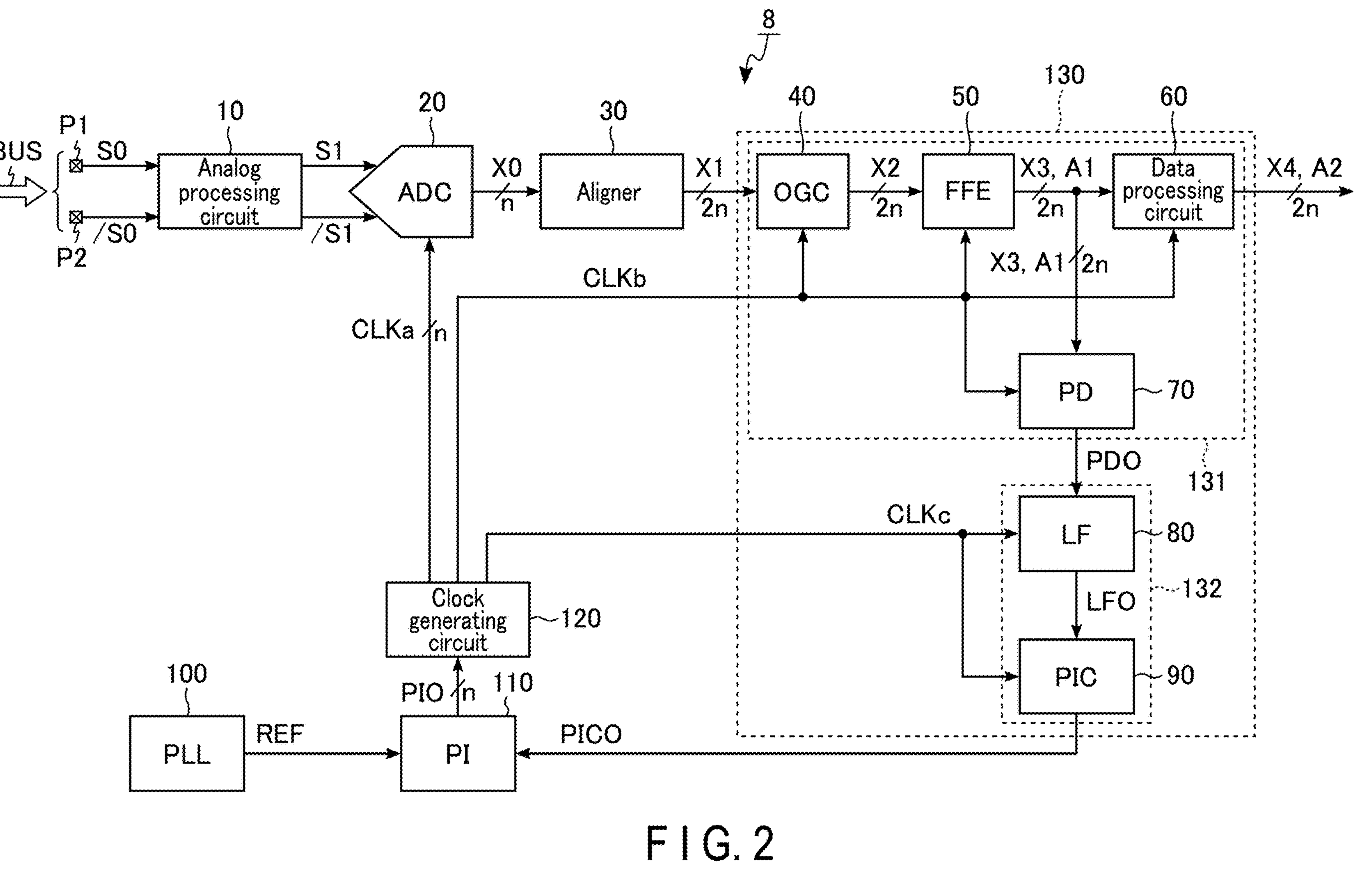
FIG. 2 is a block diagram showing an exemplary configuration of a receiving circuit in the receiving device according to the embodiment.

In general, according to one embodiment, a semiconductor integrated circuit includes a first converter, a second converter, a first processing circuit and a second processing circuit. The first converter is configured to sample a first digital value from an analog signal based on a first clock signal. The second converter is configured to sample a second digital value from the analog signal based on a second clock signal differing from the first clock signal by a first phase. The first processing circuit is configured to calculate a phase shift of the first clock signal and the second clock signal based on the first digital value and the second digital value and using a first frequency of a third clock signal as an operating frequency. The second processing circuit is configured to generate a control signal for correcting the phase shift of the first clock signal and the second clock signal based on the phase shift calculated by the first processing circuit and using a second frequency of a fourth clock signal as an operating frequency. The second frequency is $2^m$ times the first frequency, where m is an integer equal to or greater than 1.

Embodiments will be described with reference to the drawings. The description will use the same reference signs for the structural features or components having the same or substantially the same functions and configurations, and may add characters or numbers to the respective ends of the same reference signs. Each functional block may be realized in the form of hardware, computer software, or a combination thereof. Each functional block is not required to be defined or specified as will be described for the following embodiments and examples. For example, functions may be partly performed by a functional block different from the exemplary functional blocks. Also, each exemplary functional block may be divided into more specific functional sub-blocks.

1. Configurations of Embodiments

A configuration of a receiving device according to an embodiment will be described.

1.1 Information Processing System

First, a description will be given of a configuration of an information processing system which includes the receiving device according to the embodiment. FIG. 1 is a block diagram showing an exemplary configuration of the information processing system including the receiving device according to the embodiment.

An information processing system 1 is a system adapted for transmission of information through serial communications. The information processing system 1 includes a host device 2 and a memory system 3. The memory system 3 is connectable to the host device 2 via a host bus BUS.

The host device 2 is an information processing device outside the memory system 3. The host device 2 may be, for example, a personal computer or a server installed in a data center. The host device 2 sends various requests to the memory system 3. In sending a request to the memory system 3, the host device 2 functions as a transmitting device.

The memory system 3 is a storage device. The memory system 3 may be, for example, a universal flash storage (UFS) device, a solid state drive (SSD), or a memory card such as an SD™ card. The memory system 3 performs operations such as write, read, and erase operations of data according to commands from the host device 2. In receiving a command from the host device 2, the memory system 3 functions as a receiving device.

1.2 Memory System (Receiving Device)

With reference to FIG. 1, an internal configuration of the receiving device according to the embodiment, namely, the memory system 3, will be described.

The memory system 3 includes a memory device 4 and a memory controller 5.

In one example, the memory device 4 is a nonvolatile memory. Examples of the memory device 4 include a NAND flash memory. The memory device 4 stores data in a nonvolatile manner.

In one example, the memory controller 5 is constituted by an integrated circuit such as a system-on-a-chip (SoC). The memory controller 5 controls the memory device 4 based on commands from the host device 2. More specifically, and for example, the memory controller 5 writes write data in the memory device 4 based on a write command from the host device 2. Also, the memory controller 5 reads read data from the memory device 4 based on a read command from the host device 2. The memory controller 5 then sends the read data to the host device 2.

Next, an internal configuration of the memory controller 5 will be described. The memory controller 5 includes a control unit (control circuit) 6, a buffer memory 7, a host interface circuit (host I/F) 8, and a memory interface circuit (memory I/F) 9. Functions of the memory controller 5 which will be explained later may be realized by a hardware structure or a combination of hardware resources and firmware.

The control unit 6 is a circuit which takes total control over the memory controller 5. In one example, the control unit 6 includes a processor such as a central processing unit (CPU), and a read only memory (ROM).

In one example, the buffer memory 7 is a static random access memory (SRAM). The buffer memory 7 is provided for buffering data transmitted between the host device 2 and the memory device 4. The buffer memory 7 temporarily stores write data and read data. An element (memory) having a comparable function to the buffer memory 7 may be provided outside the memory controller 5.

In one example, the host interface circuit 8 is a semiconductor integrated circuit. The host interface circuit 8 controls communications between the memory controller 5 and the host device 2. In receiving a command from the host device 2, a part of the circuitry in the host interface circuit 8 functions as a receiving circuit. The host interface circuit 8 is connected to the host device 2 via the host bus BUS. The host bus BUS complies with, for example, a peripheral component interconnect express (PCIe™), a mobile industry processor interface (MIPI), a serial attached SCSI (small computer system interface) (SAS), a serial ATA (advanced technology attachment) (SATA), an SD™ interface, etc.

In one example, the memory interface circuit 9 is a semiconductor integrated circuit. The memory interface circuit 9 controls communications between the memory device 4 and the memory controller 5. The memory interface circuit 9 is connected to the memory device 4 via a memory bus. The memory bus complies with, for example, a single data rate (SDR) interface, a toggle double data rate (DDR) interface, an open NAND flash interface (ONFI), etc.

1.3 Host Interface Circuit (Receiving Circuit)

Next, a configuration of the receiving circuit included in the host interface circuit 8 will be described. FIG. 2 is a block diagram showing an exemplary configuration of the receiving circuit in the receiving device according to the embodiment.

The receiving circuit included in the host interface circuit 8 includes pads P1 and P2, an analog processing circuit 10, an ADC 20, an aligner 30, an OGC 40, an FFE 50, a data processing circuit 60, a PD 70, an LF 80, a PIC 90, a PLL 100, a PI 110, and a clock generating circuit 120.

Each of the pads P1 and P2 is a terminal for connection with the host bus BUS. By way of example, FIG. 2 illustrates a case where the pads P1 and P2 receive respective signals S0 and /S0 from the host device 2 via the host bus BUS.

The signals S0 and /S0 here are differential signals. Before passing through the host bus BUS, the signals S0 and /S0 take the form of, for example, pulse signals. Data from the host device 2 is modulated as pulses of the signals S0 and /S0. The signals S0 and /S0 have a per-pulse voltage level corresponding to data of 1 or more bits. The description will assume instances where 2-bit data is modulated for one pulse. Such a data transmission mode may also be called a "four-level pulse amplitude modulation (PAM4)".

Passage through the host bus BUS gives the signals S0 and /S0 a loss due to the transmission characteristics (e.g., frequency characteristics) of the host bus BUS. This produces an inter-symbol interference (ISI) in the signals S0 and /S0 that have passed through the host bus BUS. Accordingly, the signals S0 and /S0 that have passed through the host bus BUS are processed as analog signals.

The analog processing circuit 10 is an analog front end (AFE). In one example, the analog processing circuit 10 includes a continuous time linear equalizer (CTLE) and a variable gain amplifier (VGA). The CTLE is an amplifying circuit which has such frequency characteristics as compensating for the frequency characteristics of the host bus BUS. The VGA is an amplifying circuit capable of changing a gain.

The analog processing circuit 10 receives inputs of the signals S0 and /S0 from the pads P1 and P2, respectively. The analog processing circuit 10 performs analog processing on the signals S0 and /S0 using the CTLE and VGA. The analog processing circuit 10 thus generates signals S1 and /S1 based on the signals S0 and /S0. The analog processing circuit 10 outputs the signals S1 and /S1 to the ADC 20.

In one example, the ADC 20 is an analog-to-digital converting circuit adopting a time interleaving scheme. The ADC 20 receives inputs of the signals S1 and /S1 from the analog processing circuit 10 and an input of a clock signal CLKa from the clock generating circuit 120. The ADC 20 converts the signals S1 and /S1 into a signal X0 based on the signal CLKa. The ADC 20 outputs the signal X0 to the aligner 30.

The signal CLKa is constituted by n clock signals. Here, n is an integer equal to or greater than 1 (e.g., 40). The n clock signals in the signal CLKa differ in phase from one another by, for example, at least 360°/n. In the following description, the n clock signals in the signal CLKa may be called a "signal CLKa_1", a "signal CLKa_2", . . . , and a "signal CLKa_n" for distinction from one another. The signal CLKa is, in other words, a signal having n phases. The signal CLKa has a frequency corresponding to 1/n of the frequency of the clock signal embedded in the signals S0 and /S0 by the host device 2. The frequency of the signal CLKa is, for example, 1.6 GHZ.

The signal X0 is a digital signal. The signal X0 includes multiple consecutive digital values. The bit value of one digital value included in the signal X0 is sampled from one symbol of the signals S1 and /S1 based on one clock signal in the signal CLKa. One digital value represents, for example, 7-bit data. Here, the respective bit values of 2n consecutive digital values included in the signal X0 are sampled from n consecutive symbols of the signals S1 and /S1 based on n clock signals in the signal CLKa. In the following description, a cycle for the ADC 20 to generate *2n* consecutive digital values in the signal X0 may also simply be called a "cycle". Also, 2n consecutive digital values in the signal X0 may also be called a "signal X0 for one cycle". Further, 2n consecutive digital values in the signal X0 may be called a "signal X0_1", . . . , and a "signal X**0_2*n***" for distinction from one another.

The aligner 30 outputs, as a signal X1, the signal X0 received from the ADC 20. The aligner 30 receives an input of the signal X0 from the ADC 20 via n transmission paths.

Here, the aligner 30 converts the received signal X0 into the signal X1 which can be transmitted via 2n transmission paths. The aligner 30 outputs the signal X1 to the OGC 40.

The OGC 40 is an offset gain correcting circuit. A clock signal CLKb is supplied to the OGC 40. The clock signal CLKb provides an operating frequency (or a clock frequency) for the OGC 40. The frequency of the signal CLKb is, for example, 0.8 GHz. The OGC 40 receives an input of the signal X1. The signal X1 has an offset error and a gain error produced at the conversion of the signals S1 and /S1 into the signal X0 by the ADC 20. The OGC 40 corrects the offset error and the gain error involved in the signal X1. The OGC 40 outputs a signal X2 after the correction to the FFE 50.

The FFE 50 is a feed forward equalizer (FFE). The clock signal CLKb is likewise supplied to the FFE 50. The clock signal CLKb provides an operating frequency for the FFE 50. In one example, the frequency of the signal CLKb is 0.8 GHz as mentioned above. The FFE 50 shapes the waveform of the signal X2 to generate a waveform-shaped signal X2. More specifically, the FFE 50 receives an input of the signal X2 for each cycle. The FFE 50 extracts, from the generated signal X2, a signal X3 and data A1 for the clock signal. The FFE 50 outputs the signal X3 and the data A1 to the PD 70 and the data processing circuit 60.

The data processing circuit 60 performs a variety of processing on the signal X3 and the data A1. The clock signal CLKb is supplied to the data processing circuit 60. The clock signal CLKb provides an operating frequency for the data processing circuit 60. In one example, the frequency of the signal CLKb is 0.8 GHZ as mentioned above. The data processing circuit 60 receives inputs of the signal X3 and the data A1. In one example, the data processing circuit 60 includes an FFE. The data processing circuit 60 processes the signal X3 and the data A1 having waveforms shaped by the FFE to generate a signal X4 and data A2. The data processing circuit 60 outputs the signal X4 and the data A2 to a subsequent circuit (not shown in the figure).

The PD 70 is, in one example, a Mueller-Muller (MM) baud-rate phase detector. The clock signal CLKb is supplied to the PD 70. The clock signal CLKb provides an operating frequency for the PD 70. In one example, the frequency of the signal CLKb is 0.8 GHZ as mentioned above. For detecting a phase shift of the signal CLKa used in the ADC 20, the MM baud-rate phase detector uses one sampling result for one symbol. For detecting a phase shift, the MM baud-rate phase detector does not use the sampling result for the edge (boundary) of a pulse corresponding to the data encoded in the signals S0 and /S0. More specifically, the PD 70 receives inputs of the signal X3 and the data A1 from the FFE 50. The PD 70 generates a value PDO based on the signal X3 and the data A1. The value PDO corresponds to a phase shift between the current sampling timing by the signal CLKa and an optimum sampling timing in the ADC 20. The PD 70 outputs the value PDO to the LF 80.

The LF 80 is a loop filter. A clock signal CLKc is supplied to the LF 80. The clock signal CLKc provides an operating frequency for the LF 80. The frequency of the signal CLKc is, for example, 1.6 GHz. The LF 80 receives an input of the value PDO from the PD 70. The LF 80 integrates the input value PDO to calculate a value LFO corresponding to the value PDO after integration. The value LFO is a value corresponding to the integrated value obtained by integrating the phase shift of the signal CLKa in the ADC 20. The LF 80 outputs the value LFO to the PIC 90.

The PIC 90 is a controller for controlling the later described PI (phase interpolator) 110. The clock signal CLKc is supplied to the PIC 90. The clock signal CLKc provides an operating frequency for the PIC 90. In one example, the frequency of the signal CLKc is 1.6 GHZ as mentioned above. The PIC 90 receives an input of the value LFO from the LF 80. The PIC 90 generates a control code PICO for controlling the PI 110 based on the value LFO. The control code PICO is a code generated based on the value LFO, that is, based on the integrated value of the phase shift of the clock signal CLKa. The PIC 90 outputs the control code PICO to the PI 110.

The PLL 100 is a phase-locked loop circuit. The PLL 100 generates a reference clock signal REF. The PLL 100 outputs the reference clock signal REF to the PI 110. In the following description, a difference between the reference frequency of the reference clock signal REF, or the frequency of the signal CLKa, and the frequency of the clock signal embedded in the signals S0 and /S0 by the host device 2 will also be called a "frequency deviation".

The PI 110 is a phase interpolating circuit. The PI 110 receives inputs of the control code PICO and the reference clock signal REF. The PI 110 generates a signal PIO from the reference clock signal REF based on the control code PICO. The signal PIO is an n-phase signal reflecting the phase adjustment based on the control code PICO. The PI 110 outputs the signal PIO to the clock generating circuit 120.

The clock generating circuit 120 is a circuit for generating the signals CLKa, CLKb, and CLKc. More specifically, the signal PIO is input to the clock generating circuit 120. The clock generating circuit 120 generates the signal CLKa with a phase shift corrected, that is, the signal CLKa in which the phase shift due to a frequency deviation has been reduced, based on the signal PIO generated according to the control code PICO. In one example, the clock generating circuit 120 uses a frequency dividing circuit for generating the signal CLKa. The clock generating circuit 120 supplies the signal CLKa to the ADC 20.

The signal CLKa has a frequency which is 2m times the frequency of the signal CLKb mentioned above. Here, m is an integer equal to or greater than 1. For the present embodiment, the description will assume that the frequency of the signal CLKa is twice the frequency of the signal CLKb. The frequency of the signal CLKa is, for example, 1.6 GHz as mentioned above.

As in the above description, the ADC 20, the aligner 30, the FFE 50, the PD 70, the LF 80, the PIC 90, the PI 110, and the clock generating circuit 120 regenerate, based on the signal X3 and the data A1 generated from the signal X0 for one cycle, the signal CLKa that will serve as a reference for the timing to sample the signal X for one subsequent cycle. Such a circulating process from the ADC 20 to the clock generating circuit 120 for each cycle may also be called a "CDR loop".

The clock generating circuit 120 also generates the signal CLKb. More specifically, the clock generating circuit 120 generates the signal CLKb based on the signal PIO. In one example, the clock generating circuit 120 uses a frequency dividing circuit for generating the signal CLKb. The clock generating circuit 120 supplies the signal CLKb to the OGC 40, the FFE 50, the PD 70, and the data processing circuit 60. In one example, the frequency of the signal CLKb is a $\frac{1}{2}^{m}$ frequency of the signal CLKa and is 0.8 GHz as mentioned above.

The clock generating circuit 120 also generates the signal CLKc. More specifically, the clock generating circuit 120 generates the signal CLKc based on the signal PIO. In one example, the clock generating circuit 120 uses a frequency dividing circuit for generating the signal CLKc. The clock generating circuit 120 supplies the signal CLKc to the LF 80 and the PIC 90. In one example, the frequency of the signal CLKc is 2m times the frequency of the signal CLKb and is 1.6 GHZ.

Note that, in one example, the receiving circuit in the host interface circuit 8 includes a digital signal processor (DSP) 130. The DSP 130 includes the OGC 40, the FFE 50, the data processing circuit 60, the PD 70, the LF 80, and the PIC 90.

The DSP 130 also includes a first digital processing circuit 131 and a second digital processing circuit 132. The first digital processing circuit 131 includes the OGC 40, the FFE 50, the data processing circuit 60, and the PD 70. The second digital processing circuit 132 includes the LF 80 and the PIC 90.

The first digital processing circuit 131 receives the clock signal CLKb. The first digital processing circuit 131 uses, as an operating frequency, a first frequency of the clock signal CLKb. The first digital processing circuit 131 calculates the phase shifts of the signals CLKa_1 to CLKa_n based on the signal X0 obtained by the conversion in the ADC 20.

The second digital processing circuit 132 receives the clock signal CLKc. The second digital processing circuit 132 uses, as an operating frequency, a second frequency of the clock signal CLKc. The second frequency is 2m times the first frequency (where m is an integer equal to or greater than 1). The second digital processing circuit 132 generates the control signal (i.e., the control code PICO) for correcting the phase shifts of the signals CLKa_1 to CLKa_n based on the phase shifts calculated by the first digital processing circuit 131.

1.3.1 ADC (Analog-to-Digital Converting Circuit)

Figure 3:
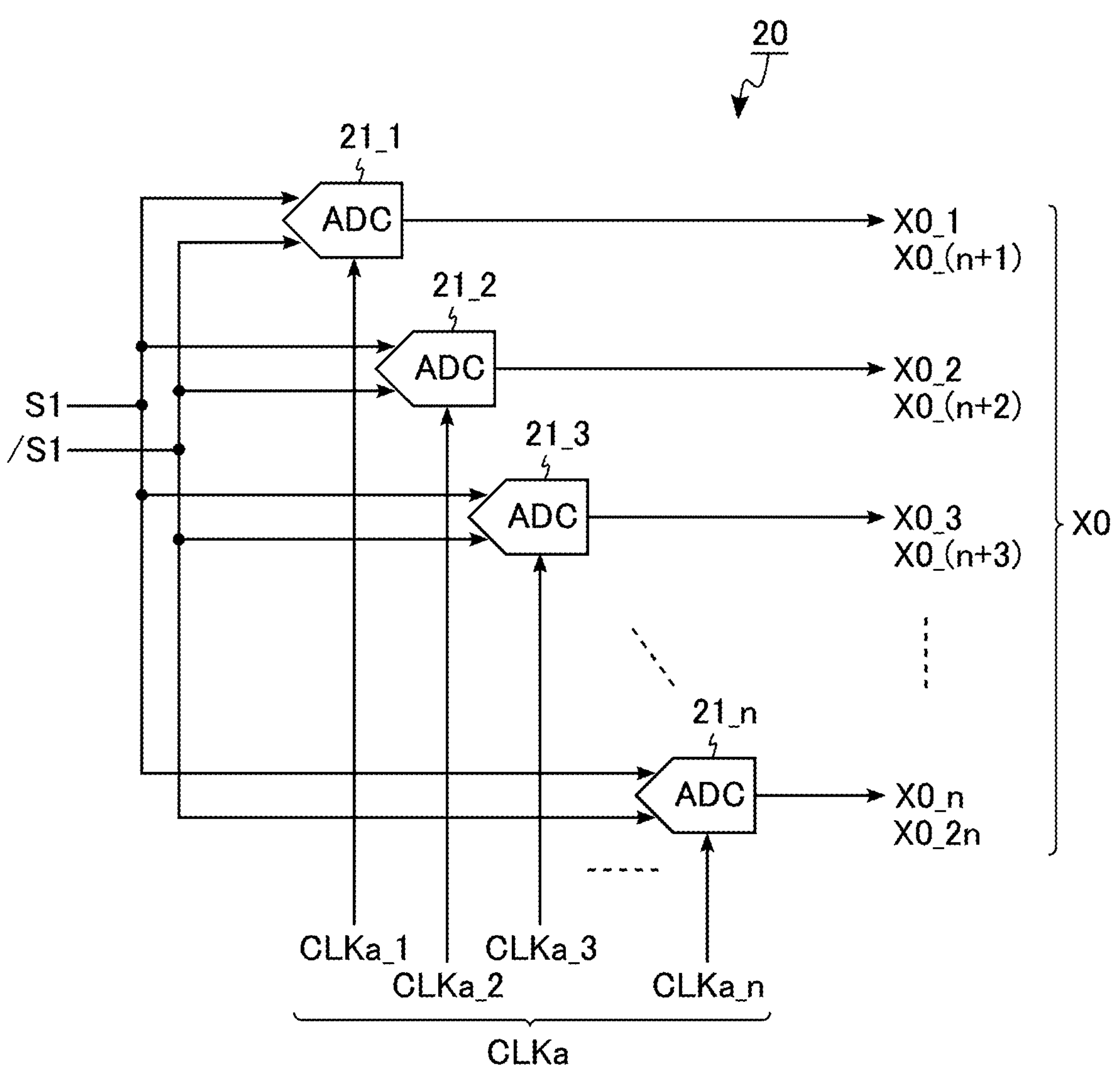
FIG. 3 is a block diagram showing an exemplary configuration of an ADC in the receiving circuit according to the embodiment.

Next, an internal configuration of the ADC 20 included in the receiving circuit will be described. FIG. 3 is a block diagram showing an exemplary configuration of the ADC in the receiving circuit according to the embodiment.

The ADC 20 includes multiple ADCs 21. The multiple ADCs 21 include n ADCs 21_1, 21_2, 21_3, . . . , and **21_*n*. Each of the ADCs 21_1 to 21_*n*** is an analog-to-digital converter (an analog-to-digital converting circuit) for converting an analog signal into a digital signal.

The n ADCs 21_1 to **21_*n* receive inputs of the signals S1 and /S1. Also, the ADCs 21_1 to 21_*n* receive the signals CLKa_1 to CLKa_n, respectively. The ADCs 21_1 to 21_*n* sample the signals S1 and /S1 based on the signals CLKa_1 to CLKa_n and output digital values X0_1, X0_2, X0_3, X0_4, . . . , X0**_(2*n*−1), and X**0_2*n* based on the sampling results, respectively. In this manner, the consecutive 2n digital values X0_1 to X0_2*n* included in the signal X0 are sampled by the ADCs 21_1 to 21_*n*** differing from one another.

There are instances where n ADCs 21_1 to **21_*n* have mutually different conversion characteristics. In more concrete terms, the sample timings for the ADCs 21_1 to 21_*n* according to the signals CLKa_1 to CLKa_n may involve minute differences. These minute differences in the sample timings form phase shifts. As such, for correcting the phase shifts created in the ADC 20, the phase adjustment of the signal CLKa is performed by the CDR loop which utilizes the configuration including the FFE 50, the PD 70, the LF 80, the PIC 90, the PI 110, and the clock generating circuit 120**.

1.3.2 PD (Phase Detecting Circuit)

Next, an internal configuration of the phase detecting circuit (i.e., the PD 70) included in the receiving circuit will be described. FIG. 4 is a block diagram showing an exemplary configuration of the phase detecting circuit in the receiving circuit according to the embodiment.

The PD 70 includes multiple multipliers 71, multiple adders 72, multiple sign function circuits 73, and an adder 74. The multiple multipliers 71 include 4n multipliers 71_1, 71_2, . . . , 71_(**4*k*−1) (not shown in the figure), 71_4*k* (not shown in the figure), . . . , 71_(4*n*−1), and 71_4*n*. The multiple adders 72 include 2n adders 72_1, . . . , 72_2*k* (not shown in the figure), and 72_2*n*. The multiple sign function circuits 73 include 2n sign function circuits 73_1, . . . , 73_2*k* (not shown in the figure), . . . , and 73_2*n***. Here, k is an integer equal to or greater than 2 and equal to or less than (2n−1) (that is, 2≤k≤2n−1).

FIG. 4 indicates the 2n digital values included in the signal X3 for one cycle to be values X3[1], . . . , and X3[2n]. Similarly, FIG. 4 indicates the 2n digital values included in the data A1 for one cycle to be values A1[1], . . . and A1[2n]. Values X3[0] and A1[0] correspond to symbols which are one symbol before the respective values X3[1] and A1[1]. For example, the values X3[0] and A1[0] mean the respective values X3[2n] included in the signal X3 and A1[2n] in the data A1 in the CDR loop for the preceding cycle. In one example, the values X3[0] and A1[0] are prestored in a register (not shown in the figure) at the time of the CDR loop for the preceding cycle.

First, the multiplier 71_1 multiplies the value X3[0] by the value A1[1]. The multiplier 71_1 outputs the calculation result, a value X3[0]A1[1], to the adder 72_1.

The multiplier 71_2 multiplies the value X3[1] by the value A1[0]. The multiplier 71_2 outputs the calculation result, a value X3[1]A1[0], to the adder 72_1.

The adder 72_1 subtracts the value X3[1]A1[0] from the value X3[0]A1[1]. The adder 72_1 outputs the calculation result, a value (X3[0]A1[1]-X3[1]A1[0]), to the sign function circuit 73_1.

The sign function circuit 73_1 determines whether the value (X3[0]A1[1]-X3[1]A1[0]) is a positive or a negative. If the value (X3[0]A1[1]-X3[1]A1[0]) is a positive, the sign function circuit 73_1 outputs "1" to the adder 74. If the value (X3[0]A1[1]-X3[1]A1[0]) is a negative, the sign function circuit 73_1 outputs "−1" to the adder 74.

Meanwhile, the multiplier 71_(**4*k*−1) multiplies the value X3[2k−1] by the value A1[2k]. The multiplier 71_(4*k*−1) outputs the calculation result, a value X3[2k−1]A1[2k], to the adder 72_2*k***.

The multiplier **71_4*k* multiplies the value X3[2k] by the value A1[2k−1]. The multiplier 71_4*k* outputs the calculation result, a value X3[2k]A1[2k−1], to the adder 72_2*k***.

The adder **72_2*k* subtracts the value X3[2k]A1[2k−1] from the value X3[2k−1]A1[2k]. The adder 72_2*k* outputs the calculation result, a value (X3[2k−1]A1[2k]-X3[2k]A1[2k−1]), to the sign function circuit 73_2*k***.

The sign function circuit **73_2*k* determines whether the value (X3[2k−1]A1[2k]-X3[2k]A1[2k−1]) is a positive or a negative. If the value (X3[2k−1]A1[2k]-X3[2k]A1[2k−1]) is a positive, the sign function circuit 73_2*k* outputs "1" to the adder 74. If the value (X3[2k−1]A1[2k]-X3[2k]A1[2k−1]) is a negative, the sign function circuit 73_2*k* outputs "−1" to the adder 74**.

These explanations on the multipliers 71_(**4*k*−1) and 71_4*k*, the adder 72_2*k*, and the sign function circuit 73_2*k*** are valid for all the values of k that are equal to or greater than 2 and equal to or less than (2n−1).

Similarly, the multiplier 71_(**4*n*−1) multiplies the value X3[2n−1] by the value A1[2n]. The multiplier 71_(4*n*−1) outputs the calculation result, a value X3[2n−1]A1[2n], to the adder 72_2*n***.

The multiplier 71_4$n$ multiplies the value X3[2n] by the value A1[2n−1]. The multiplier 71_4$n$ outputs the calculation result, a value X3[2n]A1[2n−1], to the adder 72_2$n$.

The adder 72_2$n$ subtracts the value X3[2n]A1[2n−1] from the value X3[2n−1]A1[2n]. The adder 72_2$n$ outputs the calculation result, a value (X3[2n−1]A1[2n]-X3[2n]A1[2n−1]), to the sign function circuit 73_2$n$.

The sign function circuit 73_2$n$ determines whether the value (X3[2n−1]A1[2n]-X3[2n]A1[2n−1]) is a positive or a negative. If the value (X3[2n−1]A1[2n]-X3[2]A1[2n−1]) is a positive, the sign function circuit 73_2$n$ outputs "1" to the adder 74. If the value (X3[2n−1]A1[2n]-X3[2n]A1[2n−1]) is a negative, the sign function circuit 73_2$n$ outputs "−1" to the adder 74.

The adder 74 adds together the "1" or "−1" input from each of the 2n sign function circuits 73_1 to 73_2$n$. The adder 74 outputs the calculation result, the value PDO, to the LF 80. The configuration of the PD 70 has been described.

1.3.3 LF (Loop Filter)

Figure 5:
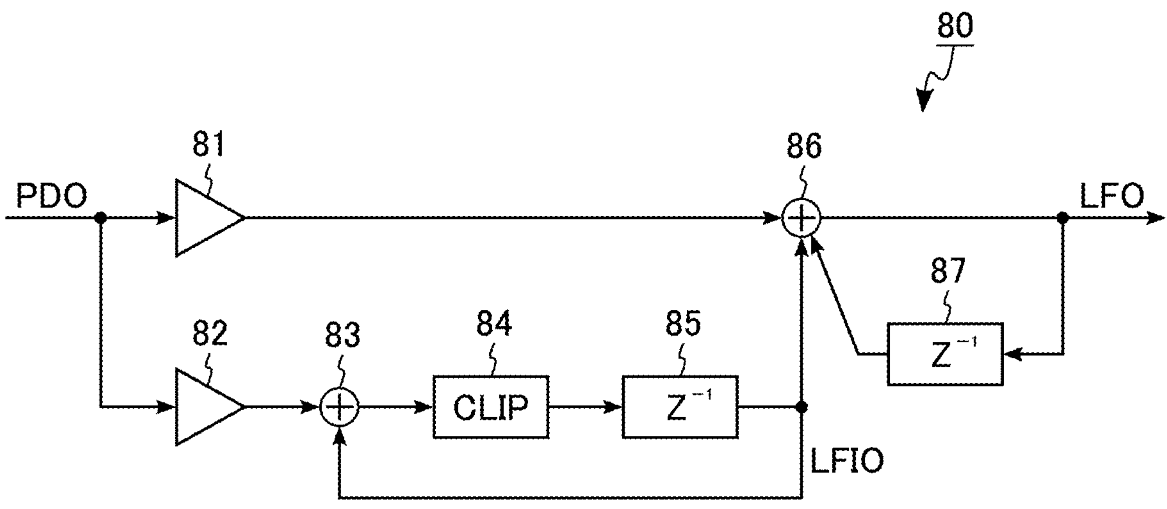
FIG. 5 is a block diagram showing an exemplary configuration of a loop filter in the receiving circuit according to the embodiment.

Next, an internal configuration of the loop filter (i.e., the LF 80) included in the receiving circuit will be described. FIG. 5 is a block diagram showing an exemplary configuration of the loop filter in the receiving circuit according to the embodiment.

The LF 80 includes multipliers 81 and 82, adders 83 and 86, a clipping circuit 84, and delay circuits 85 and 87. The multiplier 82, the adder 83, the clipping circuit 84, and the delay circuit 85 together function as an integrator.

The multiplier 81 receives an input of the value PDO. The multiplier 81 multiplies the value PDO based on a particular multiplier factor. The multiplier 81 outputs the calculation result of multiplication to the adder 86.

The multiplier 82 also receives an input of the value PDO. The multiplier 82 multiplies the value PDO based on a particular multiplier factor. The multiplier factor for the multiplier 82 may be the same as the multiplier factor for the multiplier 81. The multiplier factor for the multiplier 82 may be different from the multiplier factor for the multiplier 81. The multiplier 82 outputs the calculation result of the multiplication to the adder 83.

The adder 83 adds the calculation result of the value PDO from the multiplier 82 and a value LFIO for a previous cycle that has been fed back from the delay circuit 85. The adder 83 outputs the calculation result of the addition to the clipping circuit 84.

The clipping circuit 84 performs a clipping process to the calculation result from the adder 83. The clipping circuit 84 outputs the result of the clipping process to the delay circuit 85. More specifically, if the calculation result from the adder 83 exceeds an upper limit value, the clipping circuit 84 outputs the upper limit value to the delay circuit 85. If the calculation result from the adder 83 is less than a lower limit value, the clipping circuit 84 outputs the lower limit value to the delay circuit 85. If the calculation result from the adder 83 is equal to or greater than the lower limit value and equal to or less than the upper limit value, the clipping circuit 84 outputs the calculation result from the adder 83 to the delay circuit 85.

The delay circuit 85 delays the result of the clipping process from the clipping circuit 84 by, for example, as much as one cycle and outputs it to the adders 83 and 86 as the value LFIO. The value LFIO corresponds to the aforementioned "frequency deviation".

The adder 86 adds the value PDO that has been multiplied by the multiplier 81, the value LFIO, and the value LFO for a previous cycle that has been fed back from the delay circuit 87. The adder 86 outputs the calculation result of the addition to the delay circuit 87 and the PIC 90 as the value LFO.

The delay circuit 87 delays the value LFO by, for example, as much as one cycle and feeds it back to the adder 86. The configuration of the LF 80 has been described.

2. Operations in Embodiments

Next, operations of the receiving circuit in the receiving device according to the embodiment will be described. FIG. 6 is a flowchart showing an exemplary operation of the receiving circuit in the receiving device according to the embodiment.

In response to the analog processing circuit 10 starting receipt of signals S0 and /S0 (start receiving), the ADC 20 generates a signal X0 for one cycle by sampling and analog-to-digital (AD) converting, based on a clock signal CLKa, signals S1 and /S1 generated from the signals S0 and /S0 (S1). The ADC 20 outputs the signal X0 for one cycle to the aligner 30 via n transmission paths.

Then, the aligner 30 converts the signal X0 for one cycle into a signal X1 and outputs it to the OGC 40 via 2n transmission paths (S2).

Then, the OGC 40 generates a signal X2 by performing an offset error correction and a gain error correction for the signal X1 for one cycle. The OGC 40 outputs the signal X2 to the FFE 50 (S3). A clock signal CLKb is supplied to the OGC 40. The OGC 40 performs these operations using the frequency of the clock signal CLKb as an operating frequency.

Then, the FFE 50 shapes the waveform of the signal X2 for one cycle. The FFE 50 subsequently extracts a signal X3 and data A1 embedded in the signal X2 from the waveform-shaped signal X2 for one cycle. The signal X3 is a signal for the clock signal embedded in the signals S0 and /S0 by the host device 2. The FFE 50 outputs the signal X3 and the data A1 to the PD 70 and the data processing circuit 60 (S4). The clock signal CLKb is supplied to the FFE 50. The FFE 50 performs these operations using the frequency of the clock signal CLKb as an operating frequency.

Then, the PD 70 detects a phase shift of the signal CLKa based on each of the signal X3 and the data A1 for one cycle. The PD 70 generates a value PDO corresponding to the detected phase shift. The PD 70 outputs the value PDO to the LF 80 (S5). The clock signal CLKb is supplied to the PD 70. The PD 70 performs these operations using the frequency of the clock signal CLKb as an operating frequency.

Then, the LF 80 generates a value LFO by integrating the value PDO for one cycle. The value LFO is a value corresponding to the integrated value obtained by integrating the phase shift of the signal CLKa for one cycle. The LF 80 outputs the value LFO to the PIC 90 (S6). A clock signal CLKc is supplied to the LF 80. The LF 80 performs these operations using the frequency of the clock signal CLKc as an operating frequency.

Then, the PIC 90 generates a control code PICO based on the value LFO. The control code PICO is a code for controlling the generation of a signal PIO at the PI 110. The PIC 90 outputs the control code PICO to the PI 110 (S7). The clock signal CLKc is supplied to the PIC 90, similarly to itself being supplied to LF 80. The PIC 90 performs these operations using the frequency of the clock signal CLKc as an operating frequency.

Then, the PI 110 and the clock generating circuit 120 correct the phase shift of the signal CLKa based on the control code PICO (S8). More specifically, the PI 110 generates the phase-adjusted signal PIO using a reference clock signal REF according to the control code PICO. The signal PIO is an n-phase signal reflecting the phase adjustment based on the control code PICO. The PI 110 outputs the signal PIO to the clock generating circuit 120. The clock generating circuit 120 subsequently regenerates the signal CLKa based on the signal PIO. That is, the clock generating circuit 120 here generates a phase-shift-corrected signal CLKa based on the signal PIO; in other words, the clock generating circuit 120 regenerates the signal CLKa in which the phase shift due to a frequency deviation has been reduced. The clock generating circuit 120 supplies the regenerated signal CLKa to the ADC 20.

The host interface circuit 8 then determines whether or not the receipt of the signals S0 and /S0 is ended based on the presence or absence of inputs of the signals S1 and /S1 (S9).

If the receipt of the signals S0 and /S0 is not ended (S9; No), the ADC 20 generates the signal X0 for the next cycle based on the regenerated signal CLKa (S1). Accordingly, the processes S1 to S9 are repeated (CDR loop) until the receipt of the signals S0 and /S0 is ended.

Upon end of the receipt of the signals S0 and /S0 (S9; Yes), the receiving operation is terminated (end).

Here, the clock signal CLKb is supplied to the OGC 40, the FFE 50, the data processing circuit 60, and the PD 70 as described above. Meanwhile, the clock signal CLKc is supplied to the LF 80 and the PIC 90. The clock signal CLKc has a frequency which is 2m times the frequency of the clock signal CLKb. For example, supposing m=1, the clock signal CLKb has a frequency of 0.8 GHZ and the clock signal CLKc has twice that frequency, i.e., 1.6 GHz. Accordingly, the LF 80 and the PIC 90 are capable of operating twice as fast as the OGC 40, the FFE 50, the data processing circuit 60, and the PD 70. This enables the acceleration of cycles for the CDR loop to correct the phase shift of the signal CLKa. That is, the phase shift of the signal CLKa can be corrected twice as often. Therefore, the phase shift which occurs in the signal CLKa supplied to the ADC 20 due to the frequency deviation can be significantly reduced.

3. Effects of Embodiments

With the semiconductor integrated circuit and the receiving device according to one or more embodiments, excellent data reproduction based on a receive signal is realized.

Effects of the embodiments will be described in detail.

According to an embodiment, circuitry components in the DSP 130 other than the LF 80 and the PIC 90 are operated at the first operating frequency of the clock signal CLKb, and the LF 80 and the PIC 90 are operated at the second operating frequency of the clock signal CLKc. The second operating frequency is 2m times the first operating frequency, that is, the first operating frequency times 2 to the power of m. Here, m is an integer equal to or greater than 1. This can accelerate the integration of the phase shift by the LF 80 and also the output of the control code for correcting the phase shift from the PIC 90. Accordingly, each timing to correct the phase shift of the clock signal CLKa supplied to the ADC 20 can be put forward. Consequently, the phase shift which occurs in the clock signal CLKa due to the frequency deviation can be reduced, and excellent data reproduction from the receive signal is realized.

Figure 7:
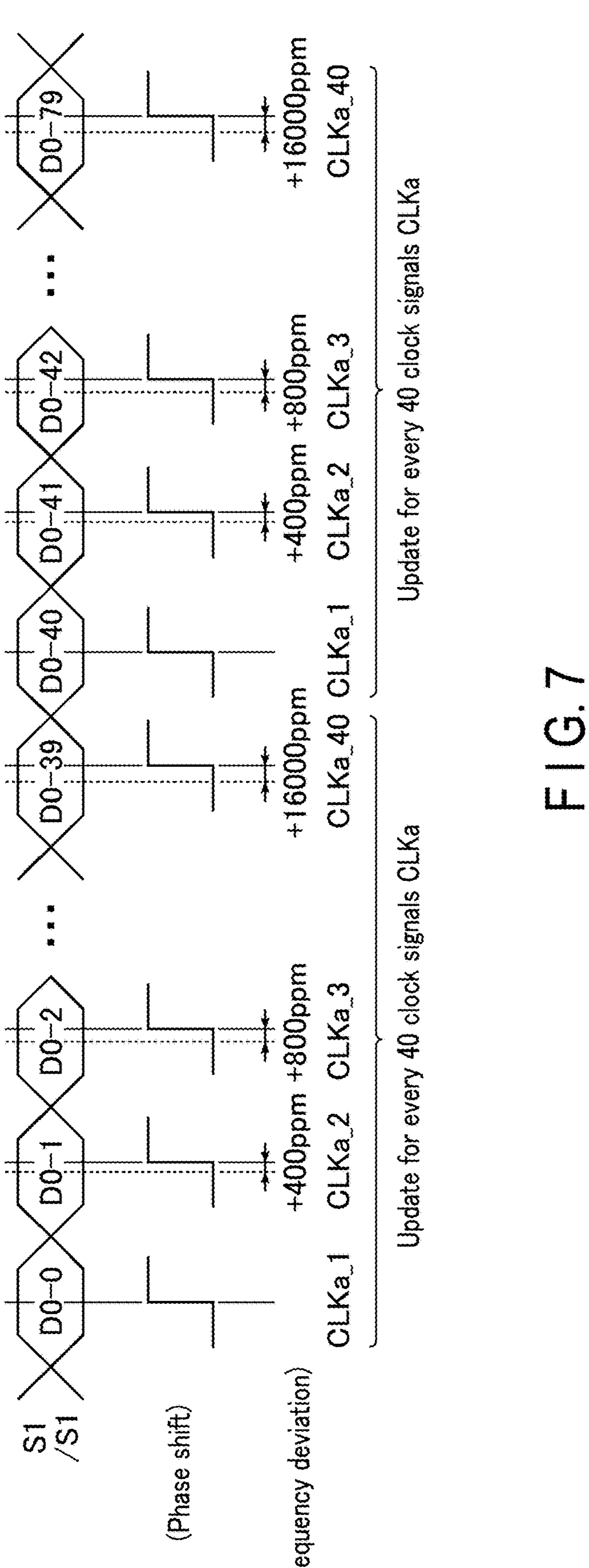
FIG. 7 is a timing chart showing a relationship between given signals and clock signals in the ADC according to the embodiment.

FIGS. 7 and 8 each show an example of a relationship between the signals S1 and /S1 and the clock signal CLKa in the course of the AD conversion by the ADC. FIG. 7 is a timing chart showing the relationship between the signals S1 and /S1 and the clock signal CLKa in the ADC 20 according to the embodiment. FIG. 8 is a timing chart showing the relationship between the signals S1 and /S1 and the clock signal CLKa in an ADC according to a comparative example. FIG. 7 assumes a configuration where the frequency of the signal CLKc is set to be twice the frequency of the signal CLKb as in the operation according to the embodiment described above, and FIG. 8 assumes a configuration where the frequency of the signal CLKc is set to be the same as the frequency of the signal CLKb. In FIGS. 7 and 8, "D0-0", "D0-1", . . . , and "D0-79" correspond to the data included in the signals S1 and /S1. It is also assumed that the frequency deviation occurring between the consecutive clock signals CLKa is +400 ppm.

As shown in FIG. 8, in the course of the AD conversion of the signals S1 and /S1, the comparative example accumulates phase shifts due to the frequency deviations of 80 clock signals CLKa. In contrast, as shown in FIG. 7, the embodiment updates the accumulated phase shifts due to frequency deviations for every 40 clock signals CLKa; in other words, the phase shift of the clock signal CLKa is corrected for every 40 signals constituting the clock signal CLKa. Therefore, as described above, the phase shift occurring in the clock signal CLKa due to the frequency deviation can be reduced, so that excellent data reproduction from the receive signal can be realized.

Also, according to an embodiment, only the LF 80 and the PIC 90 in the DSP 130 are operated at the high second operating frequency, and the circuitry components other than the LF 80 and the PIC 90 are operated at the first operating frequency lower than the second frequency. This allows for the relaxation of operation timing constraints as compared to a configuration where almost all of the circuitry components in the DSP 130 are operated at the high second operating frequency.

Moreover, according to an embodiment, the clock signal CLKb for operating the circuitry components in the DSP 130 other than the LF 80 and the PIC 90 is generated using the signal PIO generated based on the reference clock signal REF. Therefore, the clock signal CLKc supplied to the LF 80 and the PIC 90 can be easily generated using the signal PIO.

4. Others

While certain embodiments have been described, these embodiments have been presented by way of example only, and are not intended to limit the scope of the inventions. Indeed, the novel embodiments described herein may be embodied in a variety of other forms. Furthermore, various omissions, substitutions, and changes in the form of the embodiments may be made without departing from the spirit of the inventions. The accompanying claims and their equivalents are intended to cover such forms or modifications as would fall within the scope and spirit of the inventions.

What is claimed is:

1. A semiconductor integrated circuit comprising:

a first converter configured to sample a first digital value from an analog signal based on a first clock signal;

a second converter configured to sample a second digital value from the analog signal based on a second clock signal differing from the first clock signal by a first phase;

a first processing circuit configured to calculate a phase shift of the first clock signal and the second clock signal based on the first digital value and the second digital value and using a first frequency of a third clock signal as an operating frequency; and a second processing circuit configured to generate a control signal for correcting the phase shift of the first clock signal and the second clock signal based on the phase shift calculated by the first processing circuit and using a second frequency of a fourth clock signal as an operating frequency, the second frequency being 2m times the first frequency, where m is an integer equal to or greater than 1.

2. The semiconductor integrated circuit according to claim 1, wherein the first processing circuit comprises:

a first circuit configured to generate a first signal and a second signal from the first digital value and the second digital value, respectively, using the first frequency of the third clock signal as the operating frequency, and a second circuit configured to detect the phase shift of the first clock signal and the second clock signal from the first signal and the second signal using the first frequency of the third clock signal as the operating frequency.

3. The semiconductor integrated circuit according to claim 2, wherein the second processing circuit comprises:

a third circuit configured to calculate an integrated value of the phase shift by integrating the phase shift detected by the second circuit, using the second frequency of the fourth clock signal as the operating frequency, and a fourth circuit configured to generate the control signal according to the integrated value calculated by the third circuit, using the second frequency of the fourth clock signal as the operating frequency.

4. The semiconductor integrated circuit according to claim 1, further comprising:

a first circuit configured to generate, based on the control signal, a third signal for correcting the phase shift of the first clock signal and the second clock signal; and a second circuit configured to generate, based on the third signal, the first clock signal and the second clock signal in which the phase shift is corrected.

5. The semiconductor integrated circuit according to claim 1, wherein the first processing circuit comprises a circuit configured to correct an offset error and a gain error in the first digital value and the second digital value.

6. The semiconductor integrated circuit according to claim 1, wherein the second frequency of the fourth clock signal is twice the first frequency of the third clock signal.

7. A receiving device comprising:

the semiconductor integrated circuit according to claim 1; and a control circuit configured to control processing of an output signal from the semiconductor integrated circuit.

8. The receiving device according to claim 7, wherein the first processing circuit comprises:

a first circuit configured to generate a first signal and a second signal from the first digital value and the second digital value, respectively, using the first frequency of the third clock signal as the operating frequency, and a second circuit configured to detect the phase shift of the first clock signal and the second clock signal from the first signal and the second signal using the first frequency of the third clock signal as the operating frequency.

9. The receiving device according to claim 8, wherein the second processing circuit comprises:

a third circuit configured to calculate an integrated value of the phase shift by integrating the phase shift detected by the second circuit, using the second frequency of the fourth clock signal as the operating frequency, and a fourth circuit configured to generate the control signal according to the integrated value calculated by the third circuit, using the second frequency of the fourth clock signal as the operating frequency.

10. The receiving device according to claim 7, further comprising:

a first circuit configured to generate, based on the control signal, a third signal for correcting the phase shift of the first clock signal and the second clock signal; and a second circuit configured to generate, based on the third signal, the first clock signal and the second clock signal in which the phase shift is corrected.

11. The receiving device according to claim 7, wherein the first processing circuit comprises a circuit configured to correct an offset error and a gain error in the first digital value and the second digital value.

12. The receiving device according to claim 7, wherein the second frequency of the fourth clock signal is twice the first frequency of the third clock signal.

13. A receiving method comprising:

sampling a first digital value from an analog signal based on a first clock signal;

sampling a second digital value from the analog signal based on a second clock signal differing from the first clock signal by a first phase;

calculating a phase shift of the first clock signal and the second clock signal based on the first digital value and the second digital value and using a first frequency of a third clock signal as an operating frequency; and generating a control signal for correcting the phase shift of the first clock signal and the second clock signal based on the calculated phase shift and using a second frequency of a fourth clock signal as an operating frequency, the second frequency being 2m times the first frequency, where m is an integer equal to or greater than 1.

14. The receiving method according to claim 13, wherein the calculating the phase shift comprises:

generating a first signal and a second signal from the first digital value and the second digital value, respectively, using the first frequency of the third clock signal as the operating frequency, and detecting the phase shift of the first clock signal and the second clock signal from the first signal and the second signal using the first frequency of the third clock signal as the operating frequency.

15. The receiving method according to claim 14, wherein the generating the control signal comprises:

calculating an integrated value of the phase shift by integrating the detected phase shift using the second frequency of the fourth clock signal as the operating frequency, and generating the control signal according to the calculated integrated value using the second frequency of the fourth clock signal as the operating frequency.

16. The receiving method according to claim 13, further comprising:

generating, based on the control signal, a third signal for correcting the phase shift of the first clock signal and the second clock signal; and generating, based on the third signal, the first clock signal and the second clock signal in which the phase shift is corrected.

17. The receiving method according to claim 13, wherein the calculating the phase shift comprises correcting an offset error and a gain error in the first digital value and the second digital value.

18. The receiving method according to claim 13, wherein the second frequency of the fourth clock signal is twice the first frequency of the third clock signal.

* * * * *